(12) United States Patent
Wu (10) Patent No.: US 11,764,761 B2
(45) Date of Patent: Sep. 19, 2023

(54) GATED RING OSCILLATOR WITH CONSTANT DYNAMIC POWER CONSUMPTION

(71) Applicant: Fermi Research Alliance, LLC, Batavia, IL (US)

(72) Inventor: Jinyuan Wu, Aurora, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 0 days.

(21) Appl. No.: 17/669,338

(22) Filed: Feb. 10, 2022

(65) Prior Publication Data

US 2022/0166414 A1 May 26, 2022

Related U.S. Application Data (63) Continuation of application No. 16/916,473, filed on Jun. 30, 2020, now Pat. No. 11,283,430.

(51) Int. Cl.
| | | |
|---|---|---|
| H03K 3/03 | (2006.01) | |
| H03K 3/012 | (2006.01) | |
| H03K 19/20 | (2006.01) | |
| H03K 5/00 | (2006.01) | |

(52) U.S. Cl.
CPC ......... *H03K 3/0315* (2013.01); *H03K 3/012* (2013.01); *H03K 5/00* (2013.01); *H03K 19/20* (2013.01); *H03K 2005/00078* (2013.01)

(58) Field of Classification Search
CPC ...... H03B 27/00; H03K 3/012; H03K 3/0315; H03K 3/0322; H03K 5/00; H03K 19/20; H03K 2005/00078

USPC .......................................................... 331/57
See application file for complete search history.

(56) References Cited

U.S. PATENT DOCUMENTS

| | | |
|---|---|---|
| 5,389,843 A | 2/1995 | McKinney |
| 5,467,041 A | 11/1995 | Baba et al. |
| 5,617,454 A | 4/1997 | Gotz et al. |
| 5,889,440 A | 3/1999 | Kowshik |
| 6,310,928 B1 | 10/2001 | Yunome |
| 6,359,519 B1 | 3/2002 | Farrow |
| 6,924,679 B2 | 8/2005 | Seno et al. |
| 7,230,498 B2 | 6/2007 | Osvaldella |
| 7,705,687 B1 | 4/2010 | Paz |
| 7,821,862 B2 | 10/2010 | Akiba et al. |
| 8,324,974 B1 | 12/2012 | Bennett |
| 8,350,628 B1 | 1/2013 | Bennett |
| 8,816,778 B2 | 8/2014 | Bracmard et al. |
| 10,141,914 B2 | 11/2018 | Teh |
| 10,469,059 B1 | 11/2019 | Hars |
| 2003/0048141 A1 | 3/2003 | Suda |

(Continued)

*Primary Examiner* — Levi Gannon (57) ABSTRACT

A pure digital ring oscillator with constant power consumption as oscillation frequency is adjusted. Circuit topology includes a multiplexer implemented in NAND gates and a delay element positioned after a path selection NAND gate of that multiplexer such that delay element transistors may not toggle if the non-delaying signal path is selected. Assuming a delay element oscillation frequency f and a total capacitance C, and also assuming a plurality N of delay gates each characterized by a propagation delay t1 and a capacitance C1 such that C=C1*N, the ring oscillator of the present invention is characterized by a C value that is proportional to N and an f value that is inversely proportional to N. Furthermore, each of the N delay gates as well as the input and output gates of the multiplexer are characterized by a common capacitance-to-propagation delay ratio=C1/t1.

13 Claims, 7 Drawing Sheets

(56) References Cited

U.S. PATENT DOCUMENTS

2005/0248414 A1 11/2005 Osvaldella
2006/0284693 A1 12/2006 Nelson
2007/0126515 A1 6/2007 Malik
2007/0247240 A1 10/2007 Morini et al.
2018/0343004 A1 11/2018 Yoshioka et al.

PRIOR ART

GATED RING OSCILLATOR WITH CONSTANT DYNAMIC POWER CONSUMPTION

CROSS-REFERENCE TO RELATED APPLICATIONS

This application is a continuation and claims the benefit under 35 U.S.C. § 120 of U.S. patent application Ser. No. 16/916,473 filed by the inventor of the present application on Jun. 30, 2020 and titled GATED RING OSCILLATOR WITH CONSTANT DYNAMIC POWER CONSUMPTION, the entire contents of which are incorporated herein by reference.

STATEMENT REGARDING FEDERALLY SPONSORED RESEARCH OR DEVELOPMENT

The invention described in this patent application was made with Government support under the Fermi Research Alliance, LLC, Contract Number DE-AC02-07CH11359 awarded by the U.S. Department of Energy. The Government has certain rights in the invention.

FIELD OF THE INVENTION

The present invention relates generally to gated ring oscillator technology. More particularly, this invention pertains to gated ring oscillator circuit topology design for advantageous power management and/or optimization.

BACKGROUND OF THE INVENTION

As a matter of definition, an oscillator is a circuit which produces a continuous, repeated, alternating waveform without any input. Oscillators convert unidirectional current flow from a direct current (DC) source into an alternating waveform of a desired frequency, as dictated by its circuit components. A ring oscillator is a device composed of an odd number of NOT gates, the output of which oscillates between two voltage levels representing true and false. The NOT gates, or inverters, are typically attached in series with the output of the last inverter being fed back into the first inverter.

Ring oscillators are useful building blocks in a wide range of digitization electronics including time-to-digital convertor (TDC) and analog-to-digital convertor (ADC) implementations. In complementary metal-oxide-semiconductor (CMOS) technologies, the oscillators are often built with starved transistors and oscillation frequencies are adjusted with control voltages. Gated ring oscillators (GRO) may be implemented using a mix signal approach, which usually requires functional analog blocks (such as digital-to-analog convertors (DAC), amplifiers, and/or voltage references) that must be powered with constant current and, therefore, consume higher power than digital blocks. Alternatively, GROs may be implemented using a purely digital approach, which consumes no static current and, therefore, saves power compared to mixed signal designs.

Figure 1:
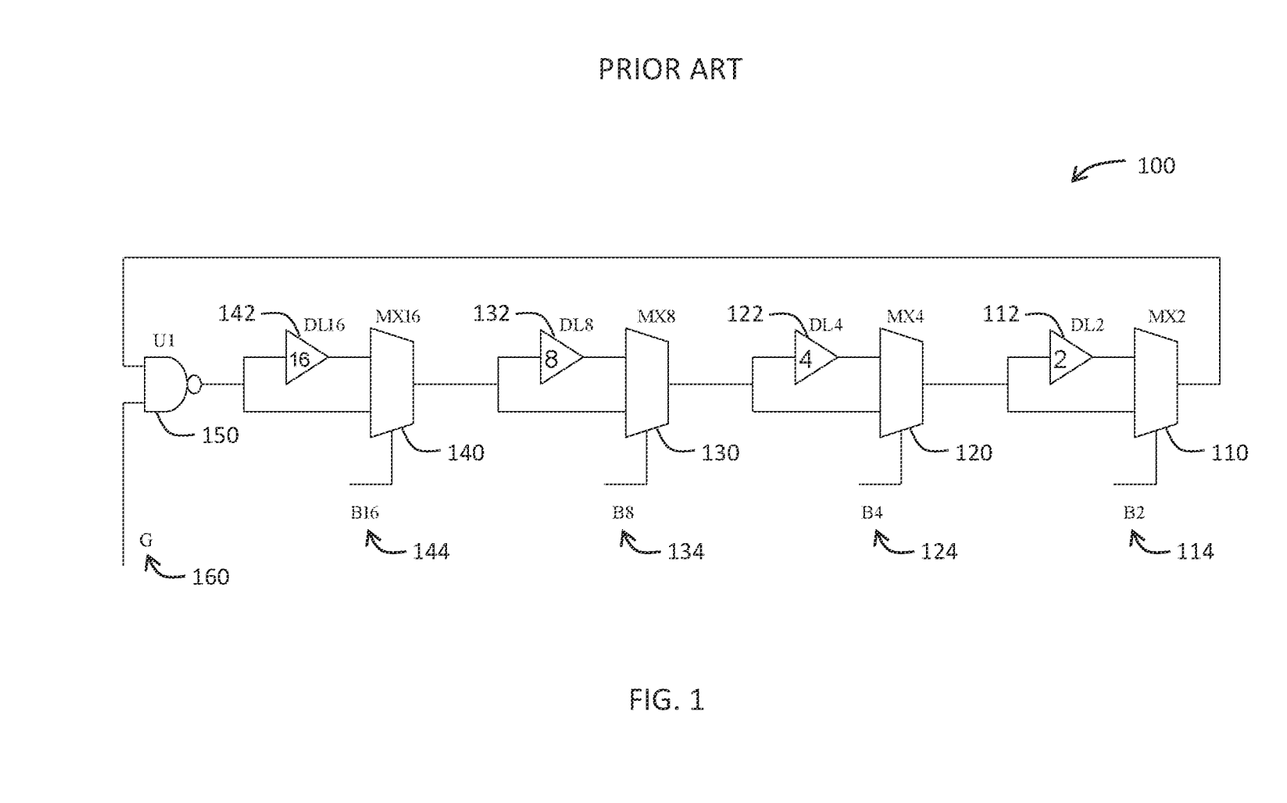
FIG. 1 is a circuit diagram of an exemplary pure digital gated ring oscillator with adjustable frequency according to the prior art.

The schematic diagram at FIG. 1 shows an exemplary circuit structure 100 of a pure digital gated ring oscillator with adjustable frequency which may be representative of the prior art. The oscillator circuit 100 may comprise some number of multiplexers, depending on the designer's frequency requirement. As illustrated, four multiplexers are denoted as MX2 110, MX4 120, MX8 130 and MX16 140 with corresponding delay elements DL2 112, DL4 122, DL8 132 and DL16 142, respectively, plus a NAND gate U1 150. Each of the delay elements may be implemented with a corresponding number of inverters (e.g., two (2) inverters within DL2 112, four (4) inverters within DL4 122, eight (8) inverters within DL8 132, and sixteen (16) inverters within DL16 142). An even number of inverters may be chosen so that the propagation delays of positive or negative transitions may be balanced. When the gate signal G 160 is in logic 0 state, the entire circuit 100 is held in a static state. When G 160 becomes logic 1, the circuit 100 starts to oscillate. When control signals B2 114, B4 124, B8 134 and B16 144 are set to logic 1, the corresponding delay elements 112, 122, 132, and 142, respectively, are included in the delay loop of the circuit 100. These same delay elements are excluded when the corresponding control signals are set to logic 0. The delay elements 112, 122, 132, and 142 delay the logic transition by 2, 4, 8 and 16 units (usually in the order of sub-nanoseconds (ns)), respectively, and when these delay elements 112, 122, 132, and 142 are selected by the control signals B2 114, B4 124, B8 134, and/or B16 144, respectively, a timing delay variation from 0 to 30 units may be created for the operating circuit 100. The oscillation frequency f of the entire circuit 100 as adjusted by setting the control signals B2 114, B4 124, B8 134, and/or B16 144, may be modeled as follows:

$$f = 1/(2*t1*N)$$

where t1 is the unit delay time and N is the total number of equivalent delay cells. The total number of equivalent delay cells N may be further written as follows:

$$N = N0 + 2*B2 + 4*B4 + 8*B8 + 16*B16$$

where N0 is the constant portion contributed by the NAND gate 150 and multiplexers 110, 120, 130, and 140; and B2 114, B4, 124, B8 134, and B16 144 can have values 0 or 1.

A known problem with pure digital GRO circuit designs of the prior art is that the power consumption of such devices changes as frequency is adjusted. Typically for many CMOS circuits, when the frequency is higher, such a circuit drains larger (dynamic) current from the input power source. This variation of the power consumption creates some complexities on internal power rail designs in integrated circuits and may degrade performance of the ring oscillator itself and/or of nearby functional blocks using the same power rail. More specifically, inside an integrated circuit chip, electrical power is distributed from power and ground pins to a local power rail via metal traces with non-zero resistance and inductance. Variation of the current drain by a functional block causes variation of the voltage on the local power rail which may change performance of the functional block itself and/or nearby functional blocks.

For example, consider a ring oscillator with unit time delay t1=0.5 ns. When the total equivalent number of delay cells N=20, the oscillation frequency f=50 megahertz (MHz). When N is changed to 10, the expected oscillation frequency would be 100 MHz. However, due to variation of the power consumption as the frequency changes, the local power rail voltage drops which, in turn, slows down all delay units in the ring oscillator. In this scenario, the oscillation frequency will be lower than the expected 100 MHz because the unit time delay t1 becomes larger than 0.5 ns.

Certain ring oscillator designs known in the prior art appear to teach variations of the common design illustrated in FIG. 1. See, for example, the following:

1) U.S. Pat. No. 7,821,862 to Akiba et al. appears to disclose an output circuit of a semiconductor memory designed to reduce current consumption at non-operation. In the output circuit, NAND gate circuits and an inverter circuit are controlled by an output control signal supplied as input to the NAND gates. A data signal and an inverted signal formed by an inverter circuit are respectively supplied to the other inputs of the NAND gates. Resultant signals are selectively passed to a "fast" channel output metal-oxide-semiconductor field-effect transistor (MOSFET) and a "slow" channel output MOSFET.

2) U.S. Pat. No. 6,924,679 to Seno et al. appears to disclose a delay reference element of a monitor circuit, the delay element comprised of a number of NAND gates connected in cascade where one input terminal of the first NAND gate receives a pulse signal from a delay deciding circuit and the output of the final NAND gate is input to the other input terminal of the first NAND gate (e.g., connected in ring). Further, one input terminal of each of the second to final NAND gates receives as input the output of the preceding NAND gates, respectively, while the other input terminal is connected to a power line for supplying a voltage.

3) U.S. Pat. No. 7,230,498 to Osvaldella appears to disclose a delay line for a ring oscillator circuit that includes at least one delay stage having multiple logic gate delay cells driven by a multiplexer. The logic gates are connected in series to each other between a first input terminal and a first output terminal of the delay cell having, in turn, a second input terminal and a second output terminal directly connected to each other by means of a fast line. The logic gates have an output terminal connected to a first input terminal of a following logic gate in the series of logic gates of the delay stage, as well as a second input terminal connected to a voltage reference (particularly, a supply voltage reference in the case of logic gates of the NAND type). The multiplexer is symmetrically configured and includes multiple logic gates that are similar to the logic of the delay stage.

A person of skill in the art will immediately recognize that the circuit designs listed above suffer from power consumption that changes as oscillation frequency is adjusted. Accordingly, a need exists for a solution to at least one of the aforementioned challenges in pure digital GRO circuit design. For instance, an established need exists for improvements in the state of the art for oscillator circuit design that reduce (or eliminate) variations in power consumption that otherwise degrade performance of the oscillator itself and/or of nearby functional blocks using the same power rail as the oscillator.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention may comprise a pure digital ring oscillator characterized by constant power consumption as the oscillation frequency of the oscillator is adjusted. Such an oscillator design may feature one or more delay elements each positioned downstream (in relation to a unidirectional current flow from a direct current (DC) source) of a path selector (switch).

In one embodiment of the present invention, a ring oscillator circuit topology may comprise a multiplexer implemented in NAND gates and a delay element positioned after a path selection NAND gate of that multiplexer such that transistors comprising the delay element may not toggle if the non-delaying signal path is selected.

In a first embodiment of the present invention, a ring oscillator may comprise a delay element; and a multiplexer. The multiplexer, which may be of a 2-to-1 type, may include a first input gate, a second input gate, an output gate, and a selection line. The delay element may be positioned along a delayed circuit path defined between the first input gate and the output gate of the multiplexer. The selection line may be operable to switch an input signal between the delayed circuit path and a non-delayed circuit path defined between the second input gate and the output gate of the multiplexer.

In another aspect of the ring oscillator, the included delay element may be characterized by an oscillation frequency f and a total capacitance C. The delay element may comprise a plurality N of delay gates each characterized by a propagation delay $t1$ and a capacitance $C1$; wherein $C=C1*N$. The ring oscillator so assembled may be characterized by a C value that is proportional to N and an f value that is inversely proportional to N. Furthermore, each of the N delay gates, the first input gate, the second input gate, and the output gate may be characterized by a common capacitance-to-propagation delay ratio=$C1/t1$.

In another aspect, the first input gate, the second input gate, and the output gate of the multiplexer each may be of a NAND gate type. Furthermore, the delay element may comprise a plurality of delay gates each of the same NAND gate type. The plurality of delay gates may be configured in electrical communication and in series. In certain embodiments, each of the plurality of delay gates may be further configured to transmit an output signal both to a respective subsequent NAND gate in the delayed circuit path and to a respective dummy NAND gate.

In yet another aspect, a ring oscillator according to another embodiment of the present invention may comprise a plurality of nested delay stages each comprising the delay element and multiplexer as described in summary above. The plurality of nested delay stages may be configured in electrical communication and in series such that a system output signal of a last-in-series of the plurality of nested delay stages is fed back into a first-in-series of the plurality of nested delay stages. In certain embodiments of the present invention, both the delayed circuit path and the non-delayed circuit path may further comprise a respective dummy NAND gate. Each of the delayed circuit path and the non-delayed circuit path may be configured to transmit a respective output signal to both the output gate and the respective dummy NAND gate.

In another embodiment of the present invention, a method of manufacturing a ring oscillator may comprise the steps of assembling some number of nested delay stages each comprising a delay element and a multiplexer configured as described in summary above; and electrically connecting the nested delay stages in series such that a system output signal of a last-in-series of the plurality of nested delay stages is fed back into a first-in-series of the plurality of nested delay stages.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Referring initially to FIGS. 3, 4A, 4B, 5A, and 5B, a gated ring oscillator with constant dynamic power consumption according to an embodiment of the present invention is now described in detail. Throughout this disclosure, the present invention may be referred to as a gated ring oscillator, a GRO, a ring oscillator, an oscillator device, an oscillator circuit, an oscillator, a circuit, an assembly, a device, a system, a product, and/or a method. Those skilled in the art will appreciate that this terminology is only illustrative and does not affect the scope of the invention. For instance, the present invention may just as easily relate to integrated circuit implementations characterized by frequency oscillation.

In general, the present invention relates to a pure digital ring oscillator circuit design characterized by constant power consumption when oscillation frequency is changed. The oscillator circuit topography of the present design may advantageously consume no static current and, therefore, save power; as well as advantageously ensure power consumption may not increase when the oscillation frequency is adjusted higher, which helps avoid complexity on the internal power rail of an integrated circuit.

The power consumption characteristics of known ring oscillator designs (such as that illustrated in FIG. 1 and described above) will now be described in more detail as a baseline for comparison. Generally speaking, known designs employ delay elements and multiplexing to change total length of a delay line, with selection logic (also referred to herein as a "selection line" and/or a "switch") present at the multiplexer inserted after the delay elements along an electrical current path (also referred to herein as a "circuit path"). Referring more specifically to the circuit diagrams 200, 202 of FIGS. 2A. and 2B, respectively, a variable delay segment 122 is shown positioned upstream of a multiplexer 120 (e.g., "upstream" meaning between an electronic signal entering the system 200, 202 and the multiplexer 120). (The multiplexer 120 may be implemented using NAND gates 210, 220, 240 as shown in FIG. 2B).

Figure 2A:
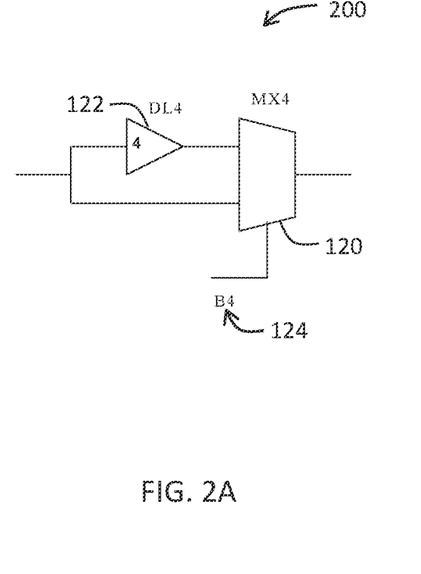
FIG. 2A is a circuit diagram of an exemplary delay element of FIG. 1.
Figure 2B:
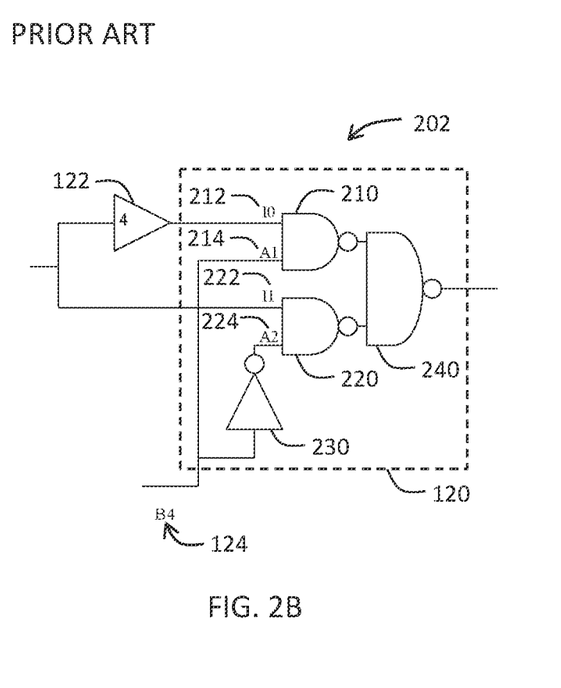
FIG. 2B is a circuit diagram of an exemplary NAND gate implementation of the delay element of FIG. 2A.

In the prior art implementations shown in FIGS. 2A and 2B, selective inclusion or exclusion of the delay element 122 in the circuit path through the multiplexer 120 may be controlled by setting the logic level of a selection line B4 124. More specifically, as illustrated in FIG. 2B, the input B4 124 of a simple 2-1 line multiplexer circuit 202 constructed from NAND gates 210, 220, 240 acts to control which input (I0 212 or I1 222) gets passed to the output gate 240. When the data select input B4 124 is low (that is, input A1 214 is at logic 0 and input A2 is at logic 1 after inversion 230), input I1 222 may pass its signal through the NAND gate 220 to the output gate 240, while input I0 212 is blocked at NAND gate 210. When the data select input B4 124 is high (that is, input A1 214 is at logic 1 and input A2 224 is at logic 0 after inversion 230), input I0 212 may pass its signal through the NAND gate 210 to the output gate 240, while input I1 222 is blocked at NAND gate 220.

Accordingly, by application of either a logic 0 or a logic 1 at selection line B4 124, the appropriate input, I0 212 or I1 222, may be selected with the circuit 202 acting like a single pole double throw (SPDT) switch. However, a person of skill in the art will immediately recognize that, per the circuit topology designs illustrated in FIGS. 2A and 2B, all transistors in the delay element 122 will toggle on and off no matter which circuit path (e.g., I0 212 or I1 222) is activated (e.g., by input A1 214 or A2 224) using the selection line B4 124, resulting in power consumption dependency on oscillation frequency.

For example, and without limitation, the dynamic power consumption of a CMOS functional block may be calculated as follows:

$$P = C*(V^2)*f$$

where V is the power supply voltage, C is the total capacitance (essentially contributed by the gates of the CMOS transistors) of the circuit nodes that flip at frequency f. If the total capacitance C in the ring oscillator may be designed to be proportional to the total number of equivalent delay cells N and each cell contributes a capacitance C1, the resultant model is as follows:

$$C = C1*N$$

Because the oscillation frequency f of the ring oscillator is inversely proportional to N, the dependence of the power consumption on N may be canceled, as follows:

$$P = (C1*N)*(V^2)*(1/(2*t1*N)) = (C1/(2*t1))*(V^2)$$

where t1 is the unit time (i.e., propagation) delay contributed by each of the N delay cells.

Therefore, to ensure power consumption stays constant while changing the oscillation frequency, two design requirements must be satisfied: first, to employ a circuit topology such that C and f are proportional and inversely proportional to N, respectively; and, second, to select all logic elements in the ring oscillator to have an identical ratio of the capacitance and propagation delay (C1/t1).

Figure 3:
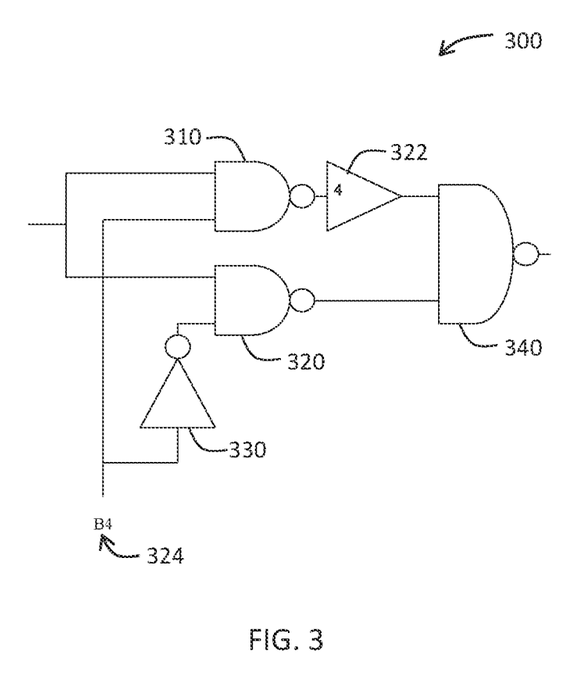
FIG. 3 is a circuit diagram of a delay stage according to an embodiment of the present invention.

Referring now to FIG. 3, the gated ring oscillator circuit topology 300 (also referred to herein as a "delay stage") of the present invention may differ, for example, and without limitation, from the prior art circuit design 202 shown in FIG. 2B at least in that the delay element 322 may be placed after a path selection NAND gate 310 (i.e., downstream of NAND gate 310 in relation to a unidirectional current flow input to the circuit 300 from a direct current (DC) source (not shown)) of a multiplexer comprising NAND gates 310, 320, and 340. In the circuit design 300, as shown, transistors in the delay element 322 advantageously may not toggle if the shorter signal path (e.g., through NAND gate 320 to NAND gate 340 of circuit 300) is chosen using selection line B4 324.

Figure 4A:
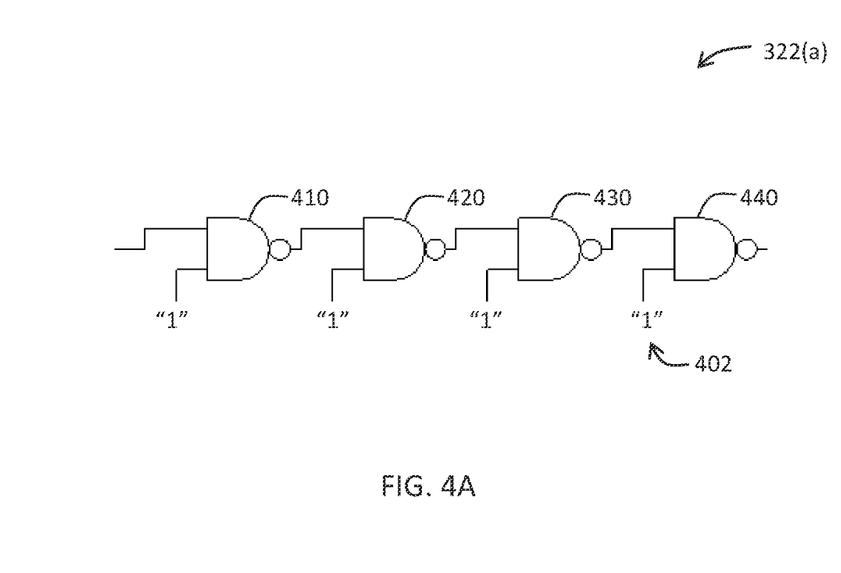
FIG. 4A is a circuit diagram of an exemplary NAND gate implementation of a delay element of the delay stage of FIG. 3.
Figure 4B:
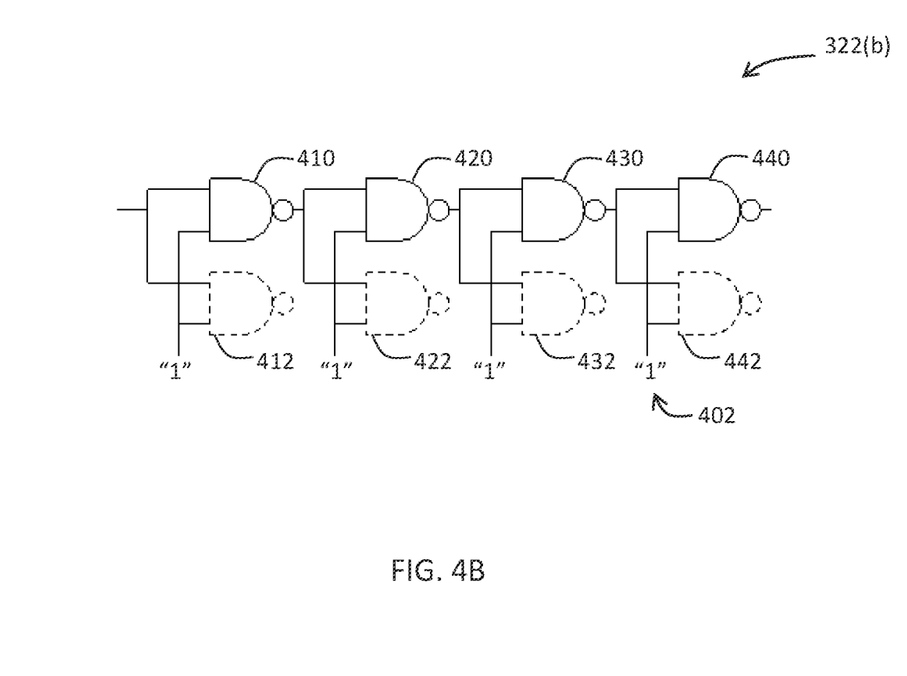
FIG. 4B is a circuit diagram of an exemplary NAND gate implementation of a delay element of the delay stage of FIG. 3.

In certain embodiments of the present invention, the delay element(s) may be built using the same type of NAND gates as those used in the multiplexer implementation. As shown in FIG. 4A, for example, and without limitation, the delay element 322(*a*) may comprise NAND gates 410, 420, 430, and 440 electrically connected in series to define a circuit path, and with one input of each of the NAND gates connected to logic 1 (as exemplified at 402). Also for example, and without limitation, because the output signal of an input NAND gate of a multiplexer may drive two loads of inputs to output NAND gates positioned subsequent in the circuit 322(*b*), dummy NAND gates 412, 422, 432, 442 (as shown in FIG. 4B marked with dashed line) may be optionally added so that all active NAND gates 410, 420, 430, 440 in the circuit 322(*b*) may drive two loads for uniformed performance without complicating calculations on the gate transistor aspect ratios.

Figure 5A:
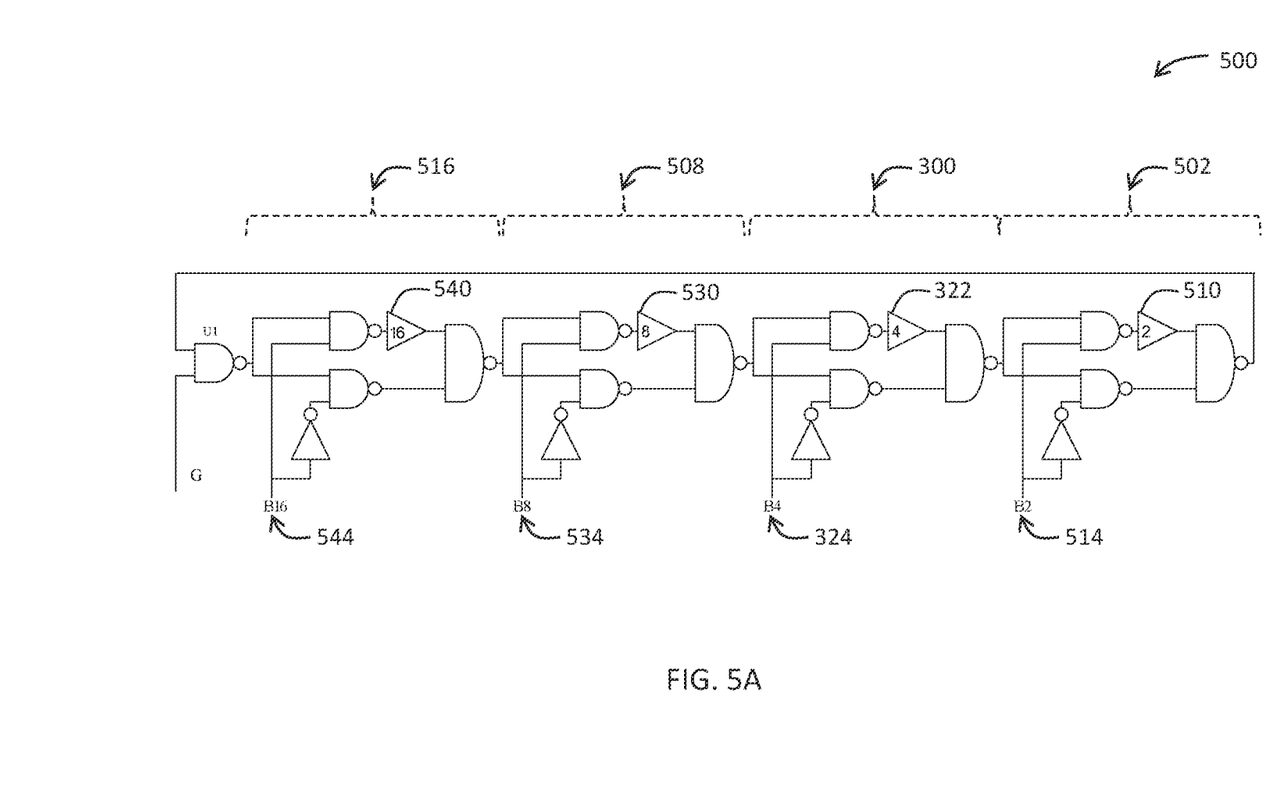
FIG. 5A is an exemplary pure digital gated ring oscillator with adjustable frequency according to an embodiment of the present invention.
Figure 5B:
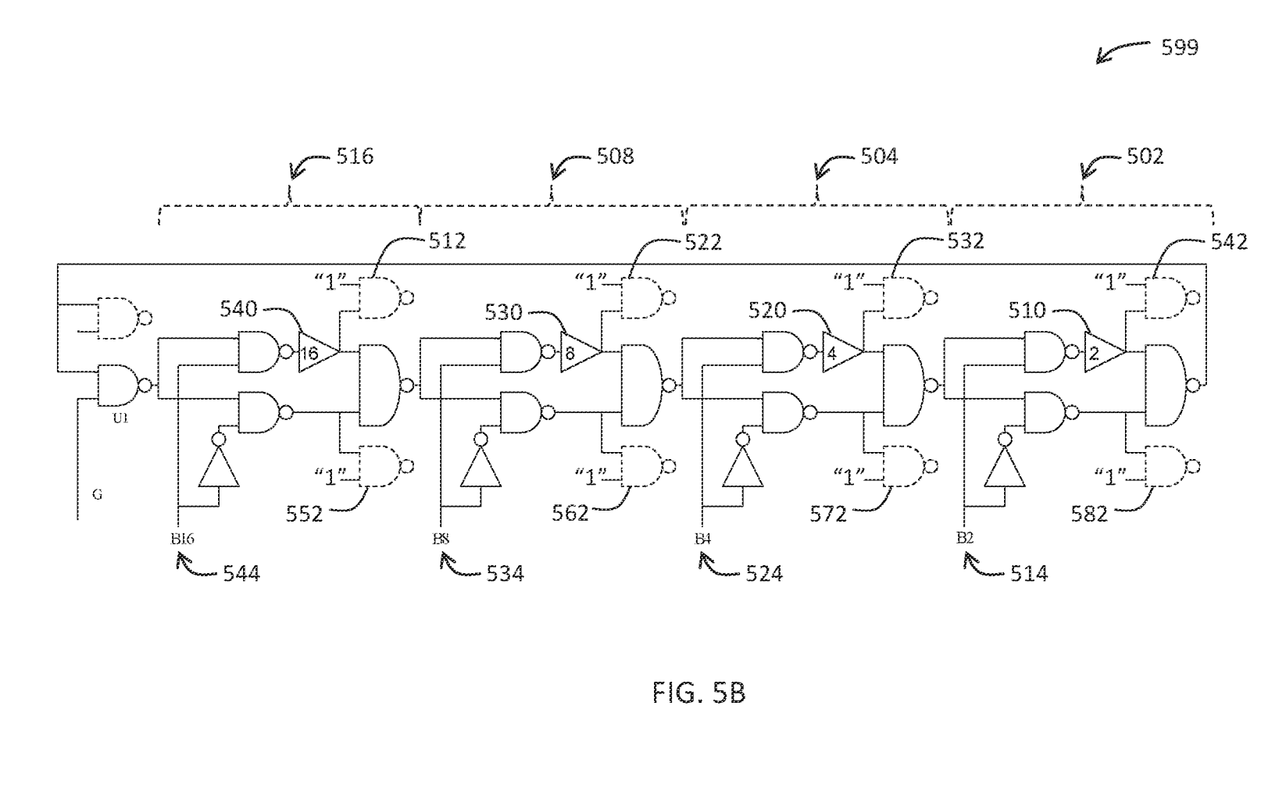
FIG. 5B is an exemplary pure digital gated ring oscillator with adjustable frequency according to an embodiment of the present invention.

Referring now to FIGS. 5A and 5B, exemplary embodiments of pure digital gated ring oscillators 500, 599 characterized by constant dynamic power consumption are shown in detail. Because the delay elements 510, 322, 530, 540 and their respective complementary multiplexers (collectively referred to as nested delay stages 502, 300, 508, and 516) may be built using identical NAND gates as described above for FIGS. 4A, 4B, all elements in the ring loops of FIGS. 5A, 5B may exhibit the same propagation delay and transistor gate capacitance. Therefore, and advantageously, the power consumption of the ring oscillator of the present design may be constant while the oscillation frequency is adjusted using any included multiplexer's selection lines 514, 324, 534, 544. Referring more specifically to FIG. 5B, optional dummy NAND gates 512, 522, 532, 542, 552, 562, 572, 582 (drawn in dashed line) may be configured to allow active input NAND gates in the circuit 599 to each drive two loads for uniformed performance without complicating calculations on the gate transistor aspect ratios. As shown in FIGS. 5A and 5B, and as described above, a ring oscillator circuit topology that comprises any number of multiplexers implemented in NAND gates with respective delay elements positioned after a path selection NAND gate of the multiplexer may advantageously not toggle the transistors in the delaying signal path when the non-delaying signal path is selected.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus, the scope of the invention should be determined by the appended claims and their legal equivalents, and not by the examples given.

What is claimed is:

1. A ring oscillator comprising:
a plurality of logic gates each of a common circuit type characterized by a common propagation delay t1 and a common capacitance C1 through a first input port of a plurality of input ports, the plurality of logic gates configured as
a multiplexer comprising a first input gate, a second input gate, and an output gate of the plurality of logic gates, and configured to define a non-delayed circuit path along the respective first input ports of the second input gate and of the output gate;
a delay element comprising an even number of the plurality of logic gates positioned in series and configured to define a delayed circuit path along the respective first input ports of the first input gate of the multiplexer, of the even number of logic gates, and of the output gate of the multiplexer; and
a selection line operable to switch, at an oscillation frequency f, an input signal between the delayed circuit path and the non-delayed circuit path;
wherein a total capacitance C of the plurality of logic gates is proportional to a sum of the plurality of logic gates, defining a delay gate count N, and the oscillation frequency f is inversely proportional to the delay gate count N; and
wherein each of the plurality of logic gates is characterized by a common capacitance-to-propagation delay ratio C1/t1.

2. The ring oscillator according to claim 1 wherein the even number plurality of logic gates further comprise a logic gate count of one of two (2), four (4), eight (8), and sixteen (16).

3. The ring oscillator according to claim 1 wherein the common circuit type is a NAND gate circuit type.

4. The ring oscillator according to claim 3 wherein the delay element is further configured to transmit an output signal both to the output gate in the delayed circuit path and to a dummy NAND gate of the plurality of logic gates.

5. The ring oscillator according to claim 1 wherein the plurality of input ports of the common circuit type consists of two input ports including the first input port.

6. A ring oscillator comprising:
a plurality of nested delay stages each comprising:
a plurality of logic gates each characterized by a common circuit type having a common propagation delay t1 and a common capacitance C1 through a first input port of a plurality of input ports, the plurality of logic gates configured as
a multiplexer comprising a first input gate, a second input gate, and an output gate of the plurality of logic gates, and configured to define a non-delayed circuit path along the respective first input ports of the second input gate and of the output gate;
a delay element comprising an even number of the plurality of logic gates positioned in series and configured to define a delayed circuit path along the respective first input ports of the first input gate of the multiplexer, of the even number of logic gates, and of the output gate of the multiplexer; and
a selection line operable to switch, at an oscillation frequency f, an input signal between the delayed circuit path and the non-delayed circuit path;
wherein a total capacitance C of the plurality of logic gates is proportional to a sum of the plurality of logic gates, defining a delay gate count N, and the oscillation frequency f is inversely proportional to the delay gate count N; and
wherein each of the plurality of logic gates is characterized by a common capacitance-to-propagation delay ratio C1/t1; and
wherein the plurality of nested delay stages is configured in electrical communication and in series such that a system output signal of a last-in-series of the plurality of nested delay stages is fed back into a first-in-series of the plurality of nested delay stages.

7. The ring oscillator according to claim 6 wherein the even number plurality of logic gates further comprises a delay gate count of one of two (2), four (4), eight (8), and sixteen (16).

8. The ring oscillator according to claim 6 wherein the common circuit type is a NAND gate circuit type.

9. The ring oscillator according to claim 8 wherein the delay element is further configured to transmit an output signal both to the output gate in the delayed circuit path and to a dummy NAND gate of the plurality of logic gates.

10. The ring oscillator according to claim 6 wherein at least one of the plurality of nested delay stages is of a 2-to-1 multiplexer type.

11. A method of manufacturing a ring oscillator, comprising the steps of:
determining a required oscillation frequency f;
determining a plurality N of logic gates each of a common circuit type characterized by a common propagation delay t1 and a common capacitance C1 through a first input port of a plurality of input ports, and by a common capacitance-to-propagation delay ratio C1/t1, wherein a total capacitance C of the plurality N of logic gates is proportional to N and wherein the required oscillation frequency f is inversely proportional to N;
assembling a multiplexer comprising a first input gate, a second input gate, and an output gate of the plurality N of logic gates, to define a non-delayed circuit path through the respective first input ports of the second input gate and of the output gate;
assembling a delay element comprising an even number of the plurality N of logic gates positioned in series, to define a delayed circuit path along the respective first input ports of the first input gate of the multiplexer, of the even number of logic gates, and of the output gate of the multiplexer; and
electrically connecting a selection line operable to switch, at the oscillation frequency f, an input signal between the delayed circuit path and the non-delayed circuit path.

12. The method according to claim 11 wherein the common circuit type is a NAND gate circuit type.

13. The method according to claim 12 wherein assembling the first delay element further comprises assembling a last-in-series of the even number plurality N logic gates in electrical communication both with a first input port of a dummy NAND gate of the plurality of logic gates and with the first input port of the output gate of the multiplexer.

* * * * *